US009299533B2

(12) United States Patent
Matsumoto (10) Patent No.: US 9,299,533 B2
(45) Date of Patent: Mar. 29, 2016

(54) MULTI CHARGED PARTICLE BEAM WRITING APPARATUS UTILIZING MULTIPLE STAGED MUTUALLY ORTHOGONAL BEAM BLANKERS

(71) Applicant: NuFlare Technology, Inc., Numazu-shi (JP)

(72) Inventor: Hiroshi Matsumoto, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 175 days.

(21) Appl. No.: 13/770,322

(22) Filed: Feb. 19, 2013

(65) Prior Publication Data
US 2013/0252145 A1 Sep. 26, 2013

(30) Foreign Application Priority Data

Mar. 22, 2012 (JP) ................. 2012-065388

(51) Int. Cl.
*H01J 37/30* (2006.01)
*H01J 37/04* (2006.01)
(Continued)

(52) U.S. Cl.
CPC ............ *H01J 37/3007* (2013.01); *B82Y 10/00* (2013.01); *B82Y 40/00* (2013.01); *H01J 37/045* (2013.01); *H01J 37/304* (2013.01);
(Continued)

(58) Field of Classification Search
CPC . H01J 37/3007; H01J 37/304; H01J 37/3177; H01J 37/045; H01J 37/147; H01J 37/1472; H01J 2237/31761; H01J 2237/31793; H01J 2237/0435; H01J 2237/0453; H01J 2237/0455; H01J 2237/31772; H01J 2237/043
See application file for complete search history.

(56) References Cited

U.S. PATENT DOCUMENTS 4,487,280 A * 12/1984 Knothe et al. ................. 177/212
5,650,631 A * 7/1997 Sohda et al. ................ 250/492.2
(Continued)

FOREIGN PATENT DOCUMENTS

JP 2005-116743 4/2005
JP 2006-261342 9/2006
(Continued)

OTHER PUBLICATIONS

U.S. Appl. No. 13/706,908, filed Dec. 6, 2012, Ryoichi Yoshikawa, et al.
(Continued)

*Primary Examiner* — Robert Kim
*Assistant Examiner* — Sean Luck
(74) *Attorney, Agent, or Firm* — Oblon, McClelland, Maier & Neustadt, L.L.P.

(57) ABSTRACT

A multi charged particle beam writing apparatus according to one aspect of the present invention includes a plurality of first blankers to respectively perform blanking deflection of a corresponding beam in multiple beams having passed through the plurality of openings of the aperture member, a plurality of second blankers to deflect a defective beam in the multiple beams having passed through the plurality of openings of the aperture member to be in a direction orthogonal to a deflection direction of the plurality of first blankers, a blanking aperture member to block each of beams which were deflected to be in a beam off state by at least one of the plurality of first blankers and the plurality of second blankers, and a detection processing unit to detect a defective beam in the multiple beams having passed through the plurality of openings of the aperture member.

7 Claims, 9 Drawing Sheets

(51) Int. Cl.
*H01J 37/304* (2006.01)
*H01J 37/317* (2006.01)
*B82Y 10/00* (2011.01)
*B82Y 40/00* (2011.01)

(52) U.S. Cl.
CPC .... *H01J 37/3177* (2013.01); *H01J 2237/0435* (2013.01); *H01J 2237/31761* (2013.01); *H01J 2237/31793* (2013.01)

(56) References Cited

U.S. PATENT DOCUMENTS

| | | | |
|---|---|---|---|
| 8,309,283 B2 | 11/2012 | Kato et al. | |
| 2003/0066974 A1* | 4/2003 | Muraki | 250/492.2 |
| 2003/0132382 A1* | 7/2003 | Sogard | 250/311 |
| 2004/0104353 A1* | 6/2004 | Berglund | 250/396 R |
| 2005/0072941 A1* | 4/2005 | Tanimoto et al. | 250/492.22 |
| 2005/0242302 A1* | 11/2005 | Platzgummer et al. | 250/492.22 |
| 2007/0029507 A1 | 2/2007 | Karel et al. | |
| 2007/0228275 A1* | 10/2007 | Fuse et al. | 250/310 |
| 2008/0061246 A1* | 3/2008 | Zhang | 250/396 R |
| 2008/0237460 A1* | 10/2008 | Fragner et al. | 250/307 |
| 2008/0283778 A1* | 11/2008 | Tomimatsu et al. | 250/492.21 |
| 2009/0206272 A1* | 8/2009 | Parker | 250/396 R |
| 2009/0212240 A1* | 8/2009 | Platzgummer et al. | 250/492.22 |
| 2009/0261267 A1* | 10/2009 | Wieland et al. | 250/396 R |
| 2010/0148087 A1* | 6/2010 | Doering et al. | 250/396 R |
| 2010/0224778 A1* | 9/2010 | Muray et al. | 250/307 |
| 2011/0253911 A1 | 10/2011 | Matsumoto | |

FOREIGN PATENT DOCUMENTS

| | | |
|---|---|---|
| JP | 2009-503844 | 1/2009 |
| JP | 4313145 | 5/2009 |

OTHER PUBLICATIONS

U.S. Appl. No. 13/792,320, filed Mar. 11, 2013, Matsumoto.
Office Action mailed on Dec. 22, 2015 for Japanese Application No. 2012-065388 (with English translation).

* cited by examiner

MULTI CHARGED PARTICLE BEAM WRITING APPARATUS UTILIZING MULTIPLE STAGED MUTUALLY ORTHOGONAL BEAM BLANKERS

CROSS-REFERENCE TO RELATED APPLICATION

This application is based upon and claims the benefit of priority from the prior Japanese Patent Application No. 2012-065388 filed on Mar. 22, 2012 in Japan, the entire contents of which are incorporated herein by reference.

BACKGROUND OF THE INVENTION

1. Field of the Invention

The present invention relates to a multi charged particle beam writing apparatus and a multi charged particle beam writing method. For example, the present invention relates to a method for achieving high accuracy in writing with multiple beams.

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer, etc. with an electron beam.

As an example using the electron beam writing technique, there is a writing apparatus using multiple beams (multibeams). Since it is possible for a multi-beam writing apparatus to perform irradiation with multiple beams at a time, throughput can be greatly increased compared with the case of writing using a single electron beam. In such a writing apparatus of a multi-beam system, for example, multiple beams are formed by letting an electron beam emitted from an electron gun assembly pass through a mask with a plurality of holes, blanking control is performed for each beam, and each of unblocked beams is reduced by an optical system and deflected by a deflector so as to irradiate a desired position on a target object or "sample" (refer to, e.g., Japanese Patent Application Laid-open (JP-A) No. 2006-261342).

In such a writing apparatus of the multi-beam system, irradiation of a plurality of beams is performed at a time, and a pattern is written by combining "beam on" and "beam off" by blanking control as described above. Regarding the writing apparatus of the multi-beam system, there is a concern about yield (generation of a defective beam) because of structural complexity for forming and controlling a plurality of beams. For example, when the beam-off control cannot be performed, a defective beam being continuously "beam on" may be generated. In addition, there is a case of generating a defective beam which does not have a specified amount of beam current or whose dose cannot be controlled within a predetermined irradiation time period even if the beam-off control can be performed. When a defective beam of this kind exists, a problem occurs in that a desired pattern is not written or desired writing accuracy is not obtained even though writing is performed.

BRIEF SUMMARY OF THE INVENTION

In accordance with one aspect of the present invention, a multi charged particle beam writing apparatus includes a stage configured to mount a target object thereon and be movable continuously, an emission unit configured to emit a charged particle beam, an aperture member, in which a plurality of openings are formed, configured to form multiple beams by letting a region including a whole of the plurality of openings be irradiated by the charged particle beam and letting parts of the charged particle beam respectively pass through a corresponding opening of the plurality of openings, a plurality of first blankers configured to respectively perform blanking deflection of a corresponding beam in multiple beams having passed through the plurality of openings of the aperture member, a plurality of second blankers configured to deflect a defective beam in the multiple beams having passed through the plurality of openings of the aperture member to be in a direction orthogonal to a deflection direction of the plurality of first blankers, a blanking aperture member configured to block each of beams which were deflected to be in a beam off state by at least one of the plurality of first blankers and the plurality of second blankers, and a detection processing unit configured to detect a defective beam in the multiple beams having passed through the plurality of openings of the aperture member.

In accordance with another aspect of the present invention, a multi charged particle beam writing method includes detecting a defective beam in multiple beams having passed through a plurality of openings of an aperture member in which the plurality of openings are formed to form multiple beams by irradiation of a charged particle beam, and performing multiple writing while executing position shifting such that positions of defective beams in the multiple writing are not located at a same position, by using at least one of remaining multiple beams in a state where the defective beam has been controlled to be beam off.

DETAILED DESCRIPTION OF THE INVENTION

Embodiment 1

In the following Embodiment, there will be described a structure in which an electron beam is used as an example of a charged particle beam. The charged particle beam is not limited to the electron beam, and other charged particle beam, such as an ion beam, may also be used.

Moreover, in the following Embodiment, there will be described an apparatus and method capable of certainly eliminating a defective beam which is always continuously "beam on" because the beam-off control cannot be performed or a defective beam whose dose cannot be controlled within a predetermined irradiation time period, in a multi beam writing system.

Figure 1:
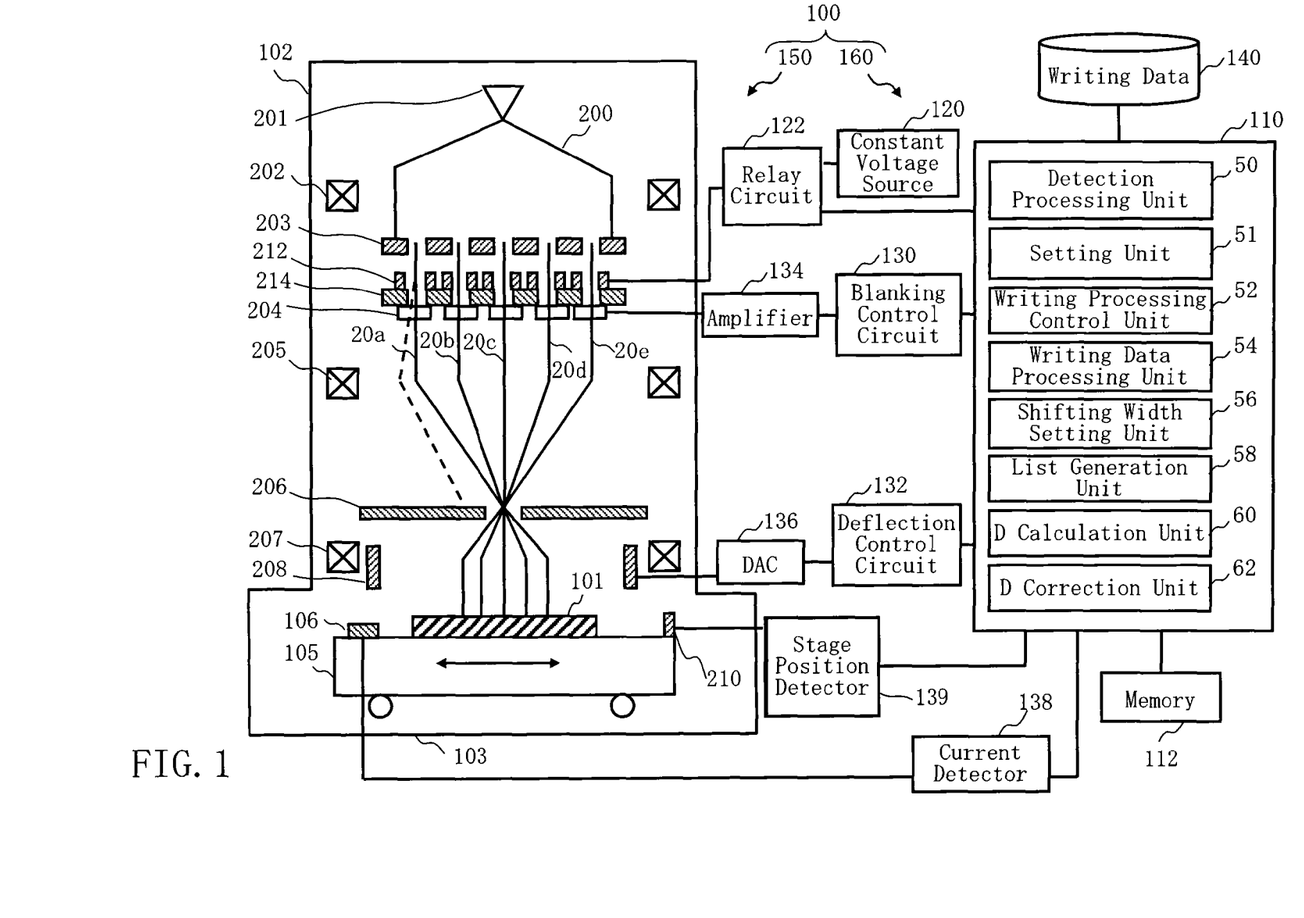
FIG. 1 is a schematic diagram showing a configuration of a writing apparatus according to Embodiment 1.

FIG. 1 is a schematic diagram showing a configuration of a writing apparatus according to Embodiment 1. In FIG. 1, a writing (or "drawing") apparatus 100 includes a writing unit 150 and a control unit 160. The writing apparatus 100 is an example of a multi charged particle beam writing apparatus. The writing unit 150 includes an electron lens barrel 102 and a writing chamber 103. In the electron lens barrel 102, there are arranged an electron gun assembly 201, an illumination lens 202, an aperture member 203, a blanking plate 214, a reducing lens 205, a limiting aperture member 206, an objective lens 207, and a deflector 208. In the writing chamber 103, there is arranged an XY stage 105, on which a target object or "sample" 101 such as a mask serving as a writing target substrate is placed when performing writing. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed. On the XY stage 105, further, there are arranged a Faraday cup 106 as an example of a current amount measurement unit, and a mirror 210 for measuring a position of the XY stage 105. Moreover, on the upper surface of the blanking plate 214, a plurality of blankers 212 (second blanker) for cutting a defective beam are arranged, and on the under surface, a plurality of blankers 204 (first blanker) for performing blanking deflection are arranged.

The controlling unit 160 includes a control computer 110, a memory 112, a constant voltage source 120, a relay circuit 122, blanking control circuits 130, deflection control circuits 132, blanking amplifier 134, digital-to-analog converter (DAC) amplifiers 136, a current detector 138, a stage position measurement unit 139, and a storage device 140 such as a magnetic disk drive. The control computer 110, the memory 112, the blanking control circuits 130, the deflection control circuits 132, the blanking amplifier 134, the digital-to-analog (DAC) amplifiers 136, a drive unit 137, the current detector 138, the stage position measurement unit 139, and the storage device 140 are mutually connected through a bus (not shown). Writing data is input into the storage device 140 (storage unit) from the outside to be stored therein.

In the control computer 110, there are arranged a detection processing unit 50, a setting unit 51, a writing processing control unit 52, a writing data processing unit 54, a shifting width setting unit 56, a list generation unit 58, a dose calculation unit 60, and a dose correction unit 62. Each function, such as the detection processing unit 50, the setting unit 51, the writing processing control unit 52, the writing data processing unit 54, the shifting width setting unit 56, the list generation unit 58, the dose calculation unit 60, and the dose correction unit 62 may be configured by hardware such as an electronic circuit, or by software such as a program executing these functions. Alternatively, it may be configured by a combination of software and hardware. The data input and output to/from the detection processing unit 50, the setting unit 51, the writing processing control unit 52, the writing data processing unit 54, the shifting width setting unit 56, the list generation unit 58, the dose calculation unit 60, and the dose correction unit 62, and data being calculated are stored in the memory 112 each time.

As described above, FIG. 1 shows a structure necessary for explaining Embodiment 1. Other structure elements generally necessary for the writing apparatus 100 may also be included.

Figure 2A:
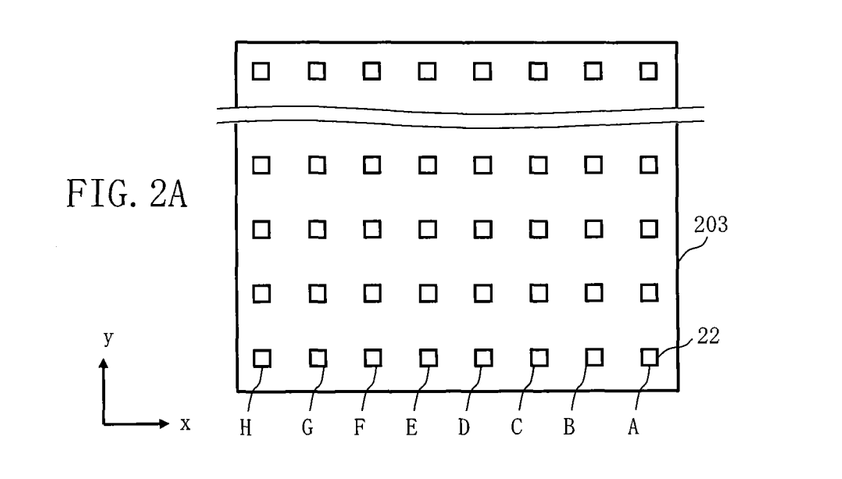
FIGS. 2A and 2B are schematic diagrams each showing a configuration of an aperture member according to Embodiment 1.
Figure 2B:
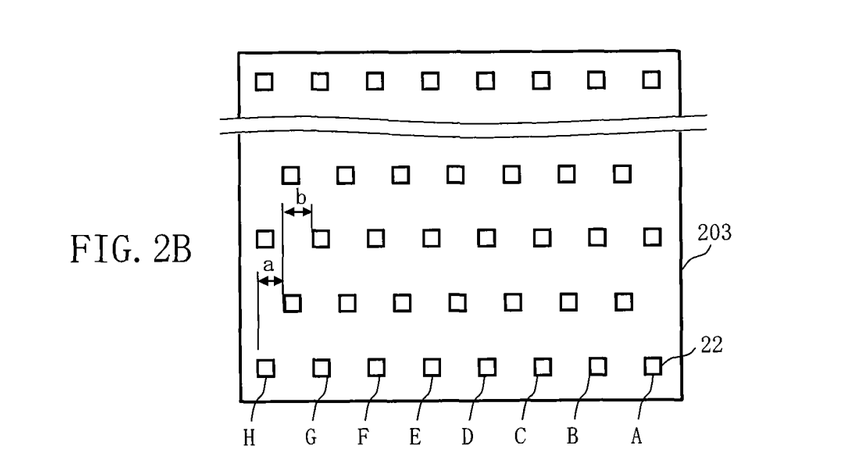

FIGS. 2A and 2B are schematic diagrams each showing an example of the configuration of an aperture member according to Embodiment 1. In FIG. 2A, holes (openings) 22 are formed in the shape of a matrix at a predetermined arrangement pitch in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. Each hole 22 has the same dimensional shape of a quadrangle. Alternatively, each hole may be a circle of the same circumference. In this case, there is shown an example of each row having eight holes 22 from A to H in the x direction. Multi-beams 20 are formed by letting parts of an electron beam 200 respectively pass through a corresponding hole of a plurality of holes 22. Here, there is shown the case where the holes 22 are arranged in two or more columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3A:
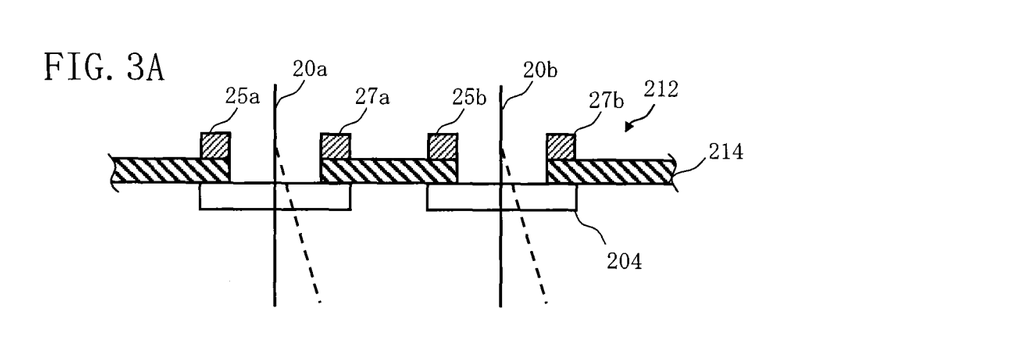
FIGS. 3A and 3B are schematic diagrams each showing a cross-sectional structure of a blanking plate according to Embodiment 1.
Figure 3B:
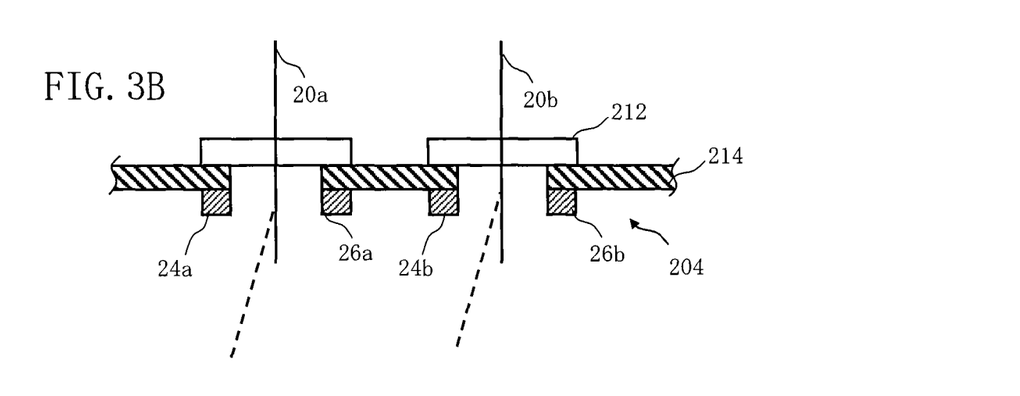
Figure 4A:
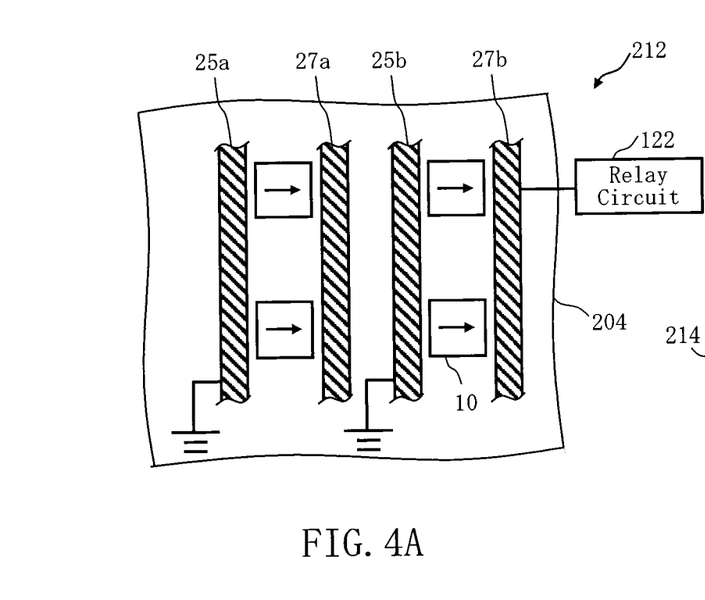
FIG. 4A shows a part of the upper surface of a blanking plate according to Embodiment 1.
Figure 4B:
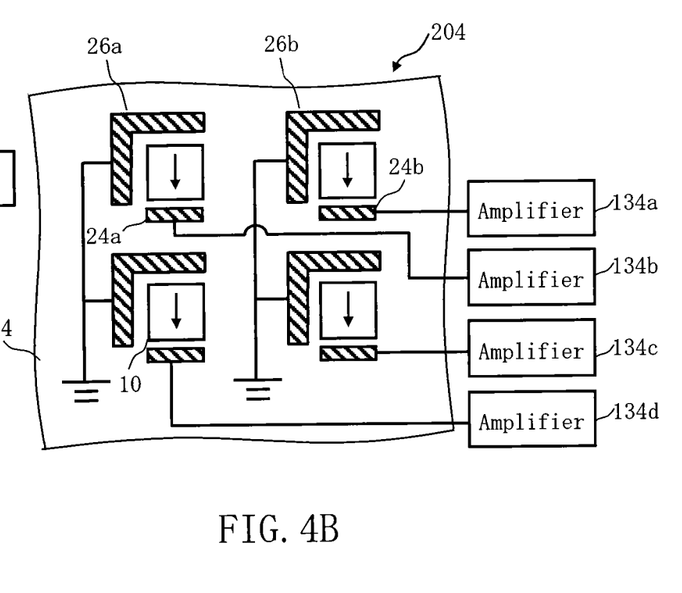
FIG. 4B shows a part of the under surface of a blanking plate according to Embodiment 1.

FIGS. 3A and 3B are schematic diagrams each showing a cross-sectional structure of a blanking plate according to Embodiment 1. The positional relation between the sections of FIGS. 3A and 3B is shifted from each other by 90 degrees. FIG. 4A shows a part of the upper surface of a blanking plate and FIG. 4B shows a part of the under surface of the blanking plate according to Embodiment 1. FIG. 3A shows the section along the arrow in FIG. 4A, seen from the direction of the lower part of FIG. 4A. FIG. 3B shows the section along the arrow in FIG. 4B, seen from the direction of the right part of FIG. 4B. A passage hole (opening) is formed in the blanking plate 214, to be corresponding to the arrangement position of each hole 22 of the aperture member 203. The blanker 212 is arranged at the upper surface side and the blanker 204 is arranged at the under surface side of each passage hole of the blanking plate 214.

For example, as shown in FIGS. 3B and 4B, the blanker 204 on the under surface is configured by two electrodes 24 and 26 being a pair. The electrode 26 at each passage hole is connected to the ground, and the electrode 24 at each passage is connected to an individual blanking amplifier 134. For example, as shown in FIG. 4B, the beam 20 is deflected toward the electrode 24 side (going downward in FIG. 4B) by applying a positive voltage from the blanking amplifier 134. Since the electrodes 24 and 26 are arranged on the under surface, the beam 20 is difficult to collide with them, thereby reducing a failure risk. The electron beams 20 passing through the respective passage holes are deflected by the voltage independently applied to the two electrodes 24 and 26 being a pair, and blanking-controlled by such deflection. Thus, each of a plurality of blankers 204 performs blanking deflection of a corresponding beam 20 in the multiple beams having passed through a plurality of holes 22 (openings) of the aperture member 203.

Figure 9:
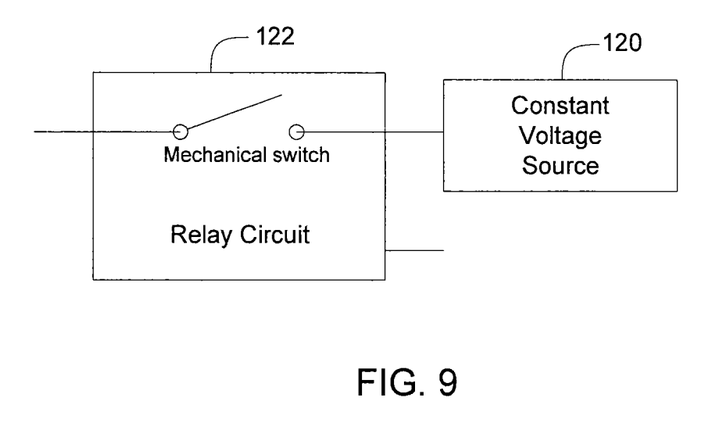
FIG. 9 is a schematic diagram showing a mechanical switch in a relay circuit according to Embodiment 1.

On the other hand, for example, as shown in FIGS. 3A and 4A, the blanker 212 on the upper surface is configured by two electrodes 25 and 27, being a pair, which are arranged in the direction orthogonal to the arrangement direction of the electrodes 24 and 26 of the blanker 204. For example, as shown in FIG. 4A, passage holes in the same column (for example, in the y direction) in a plurality of passage holes formed in the blanking plate 214 are configured by a pair of common electrodes 25 and 27. However, it is also acceptable to configure a pair of two electrodes 25 and 27 for each passage hole, without using electrodes 25 and 27 in common. Each electrode 25 is grounded and each electrode 27 is connected to an individual relay circuit 122. Usually, the electrode 27 is connected to the ground through the relay circuit 122. In this state, electron beams are not deflected. When cutting a defective beam, the relay is switched to the constant voltage source 120. For example, as shown in FIG. 4A, the electron beam is deflected toward the electrode 27 side (going to the right from the left in FIG. 4A) by applying a positive voltage from the relay circuit 122. By virtue of this configuration described above, the blanker 212 on the upper surface can deflect each beam 20 in the multiple beams, to be in the direction orthogonal to the deflection direction of the blanker 204 on the under surface. Thereby, even when a blanking electrical potential of the blanker 204 on the under surface becomes unstable, it is possible to certainly cut the beam 20 with deflection by the blanker 212 on the upper surface. Moreover, voltage is applied to each blanker 212 by the constant voltage source 120, and the on/off operation of the voltage to be applied is driven by the relay circuit 122 of a mechanical switch system. The mechanical switch of the relay circuit 122 is illustrated in FIG. 9. Compared with the blanking operation control system of the blanker 204 on the under surface which uses a semiconductor active element etc., by virtue of the simple structure of the blanker 212, a failure risk can be reduced and reliability can be achieved. A defective beam in the multiple beams having passed through a plurality of holes 22 (openings) of the aperture member 203 is deflected to be in the direction orthogonal to the deflection direction of a plurality of blankers 204, by the blanker 212 at a corresponding position in a plurality of blankers 212. Moreover, since the blanker 212 on the upper surface is used for cutting a defective beam as described later, it continuously deflects a defective beam during writing. Therefore, the blanker 212 on the upper surface is not switched to be ON or OFF during writing, though the blanker 204 on the under surface is switched to ON or OFF. Thus, since the number of switching times is small, the risk of failure can be reduced.

The electron beam 200 emitted from the electron gun assembly 201 (emission unit) almost perpendicularly illuminates the whole of the aperture member 203 by the illumination lens 202. A plurality of holes (openings), each in the shape of a quadrangle, are formed in the aperture member 203. The region including all the plurality of holes is irradiated by the electron beam 200. For example, a plurality of quadrangular electron beams (multiple beams) 20a to 20e are formed by letting parts of the electron beam 200 irradiating the positions of a plurality of holes pass through a corresponding hole of the plurality of holes of the aperture member 203 respectively. The multiple beams 20a to 20e respectively pass through corresponding blankers 212 and 204 of the blanking plate 214. The blanker 204 deflects (performs blanking deflection) the electron beam 200 which passes respectively. The multiple beams 20a to 20e having passed through the blanking plate 214 are reduced by the reducing lens 205, and go toward the hole at the center of the limiting aperture member 206. Here, the electron beam 20 which was deflected by the blanker 204 of the blanking plate 214 deviates from the hole at the center of the limiting aperture member 206 (blanking aperture member) and is blocked by the limiting aperture member 206. On the other hand, the electron beam 20 which was not deflected by the blanker 204 of the blanking plate 214 passes through the hole at the center of the limiting aperture member 206. Blanking control is performed by on/off of the blanker 204 so as to control on/off of the beam. Thus, the limiting aperture member 206 blocks each beam 20 which was deflected to be in the "beam off" state by a plurality of blankers 204. Then, one shot beam is formed by beams which have been formed during from the "beam on" state to the "beam off" state and have passed through the limiting aperture member 206. The multi-beams 20 having passed through the limiting aperture member 206 are focused by the objective lens 207 to become a pattern image of a desired reduction ratio, and respective beams (the entire multi-beams 20) having passed through the limiting aperture member 206 are collectively deflected in the same direction by the deflector 208 so as to irradiate respective irradiation positions on the target object 101. While the XY stage 105 is continuously moving, controlling is performed by the deflector 208 so that irradiation positions of beams may follow the movement of the XY stage 105, for example. Ideally, multi-beams 20 to irradiate at a time are aligned at pitches obtained by multiplying the arrangement pitch of a plurality of holes of the aperture member 203 by a desired reduction ratio described above. The writing apparatus 100 performs a writing operation by the raster scan method which continuously irradiates shot beams in order, and when writing a desired pattern, a required beam is controlled by blanking control to be "beam on" according to a pattern.

Figure 5A:
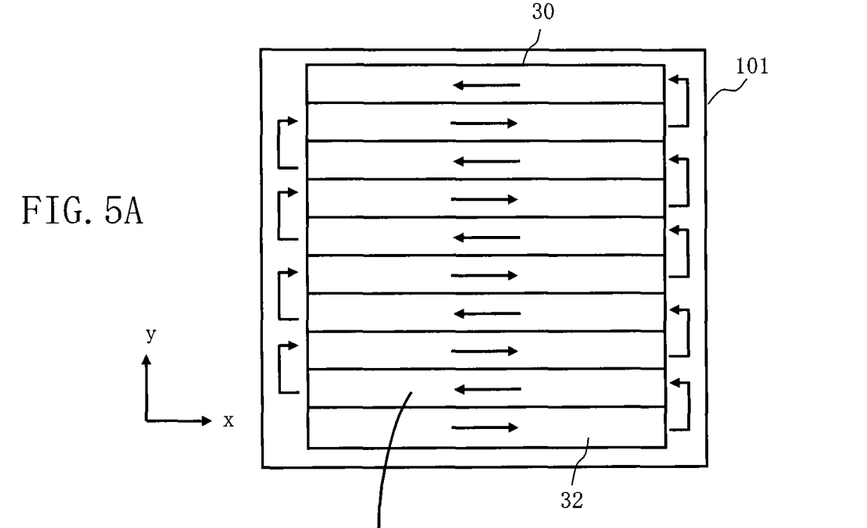
FIGS. 5A to 5C are schematic diagrams explaining a writing operation according to Embodiment 1.
Figure 5B:
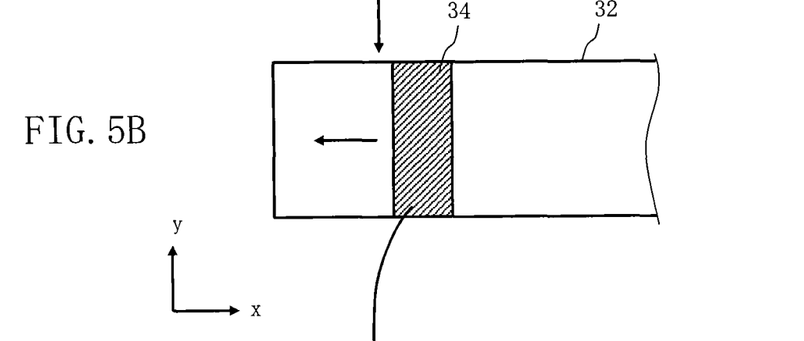
Figure 5C:
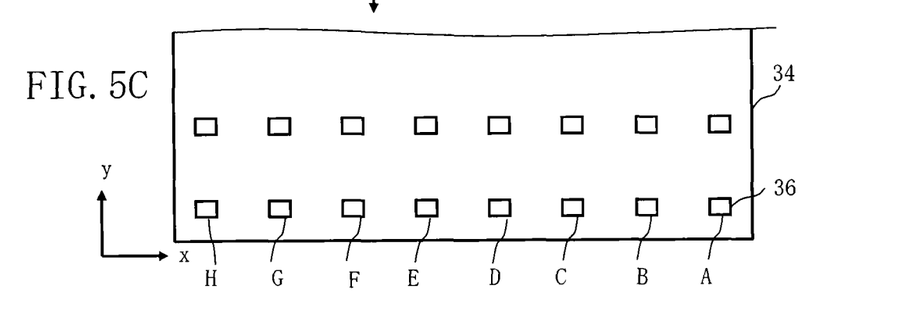

FIGS. 5A to 5C are schematic diagrams explaining a writing operation according to Embodiment 1. As shown in FIG. 5A, a writing region 30 of the target object 101 is virtually divided into a plurality of strip-shaped stripe regions 32 each having a predetermined width in the y direction, for example. Each of the stripe regions 32 serves as a writing unit region. First, the XY stage 105 is moved and adjusted such that an irradiation region 34 to be irradiated by one-time irradiation of the multi-beams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32, the stage position is moved in the −y direction and adjusted such that the irradiation region 34 is located at the right end of the second stripe region 32 or at a position more right than the right end, and located to be relatively in the y direction. Then, similarly, as shown in FIG. 5B, writing advances in the −x direction by moving the XY stage 105 in the x direction, for example. Writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also acceptable to perform writing in the same direction when writing each stripe region 32. By one shot, as shown in FIG. 5C, a plurality of shot patterns 36 of the same number as the holes 22 are formed at a time by multiple beams which have been formed by passing through respective corresponding holes 22 of the aperture member 203. For example, a beam which passed through one hole A of the aperture member 203 irradiates the position "A" shown in FIG. 5C and forms the shot pattern 36 at this position. Similarly, a beam which passed through one hole B of the aperture member 203 irradiates the position "B" shown in FIG. 5C and forms the shot pattern 36 at this position, for example. Hereafter, a similar operation is performed with respect to C to H. Then, the raster scan method is employed when writing each stripe 32, wherein while the XY stage 105 is moved in the x direction, the deflector 208 performs deflection such that each shot moves (scans) in the y direction or in the x and y directions in order and shot beam radiation is continuously delivered in order.

Figure 6:
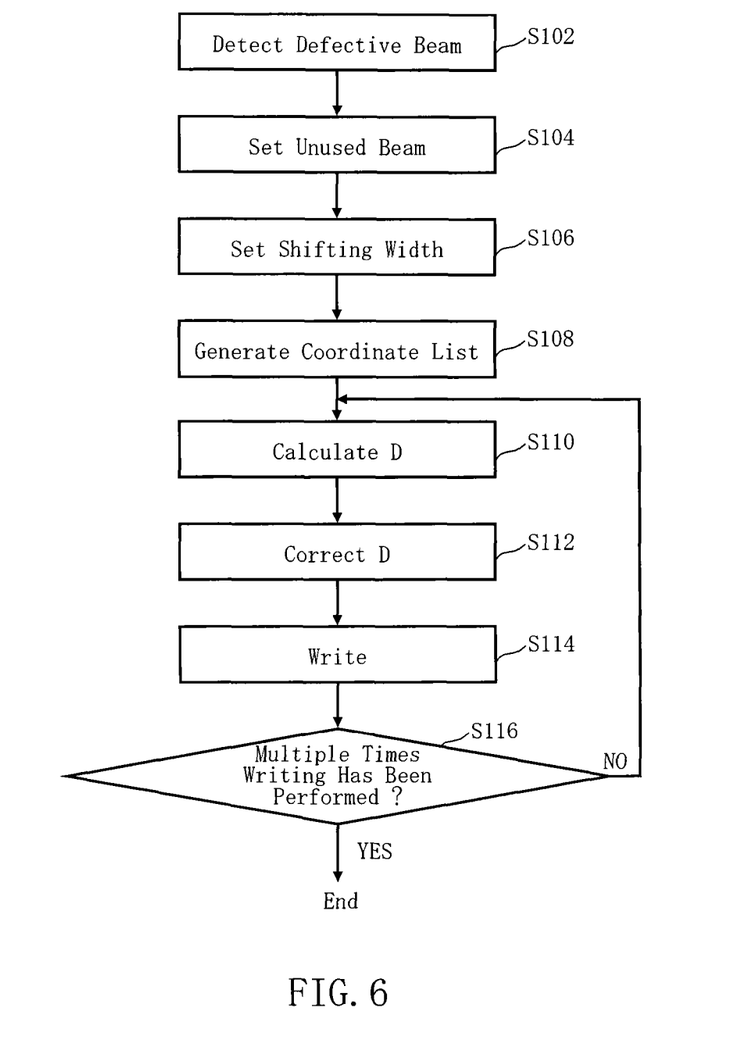
FIG. 6 is a flowchart showing main steps of a writing method according to Embodiment 1.

FIG. 6 is a flowchart showing main steps of a writing method according to Embodiment 1. In FIG. 6, the writing method according to Embodiment 1 executes a series of steps: a defective beam detection step (S102), an unused beam setting step (S104), a shifting width setting step (S106), a coordinate list generation step (S108), a dose calculation step (S110), a dose correction step (S112), a writing step (S114), and a judgment step (S116).

In the defective beam detection step (S102), the detection processing unit 50 (detection unit) detects a defective beam in the multi-beams 20 having passed through a plurality of holes 22 (openings) of the aperture member 203, where the plurality of holes 22 are provided for forming the multi-beams 20 by the irradiation of the electron beam 200. The detection method is, for example, to measure a current amount of each beam of the multi-beams 20 by the detection processing unit 50. Specifically, the XY stage 105 is moved in order so that the Faraday cup 106 may be located at the position irradiated by each beam of the multi-beams 20. The position of the XY stage 105 may be detected by letting a laser from the stage position measurement unit 139 irradiate the mirror 210 and receiving a reflected light to perform detection. The Faraday cup 106 is irradiated by each of the multi-beams 20 one by one, and an analog signal is sent to the current detector 138 from the Faraday cup 106. The current detector 138 outputs a digital signal (data signal) indicating the amount of current of each beam irradiating the Faraday cup 106 to the detection processing unit 50. Thus, the detection processing unit 50 measures a current amount of each beam irradiating the Faraday cup 106. It is preferable that beams other than the object beams to be measured are in the "beam off" state by a blanking control. Even if beams other than the measurement object beams irradiate the Faraday cup 106, it is acceptable for them to keep the "beam on" state as long as they have a positional relation not to be detected by the Faraday cup 106. If there is a beam whose current amount cannot be measured (namely, current is not detected), the beam is a defective beam which is continuously "beam off" because the beam-on control is not able to be performed. Moreover, if there is a beam which have an anomalously small or fluctuating amount of current even though the current amount is detected, the beam is a defective beam since a beam is imperfectly "beam on" and hence its dose cannot be controlled. On the other hand, if there is a beam whose beam current amount is detected even though it is controlled to be "beam off" state, the beam is a defective beam which is always continuously "beam on". Thus, based on a data signal input from the current detector 138, the detection processing unit 50 detects a beam whose current amount cannot be measured (namely, current is not detected) or whose current amount is anomalously small or fluctuating in spite of the beam-on control being set, as a defective beam, and detects a beam whose beam current amount is detected in spite of the beam-off control being set, as a defective beam.

In the unused beam setting step (S104), the setting unit 51 sets, as unused beams, beams formed by using a line of holes including a hole through which a defective beam passes in a plurality of holes 22 of the aperture member 203.

Figure 7:
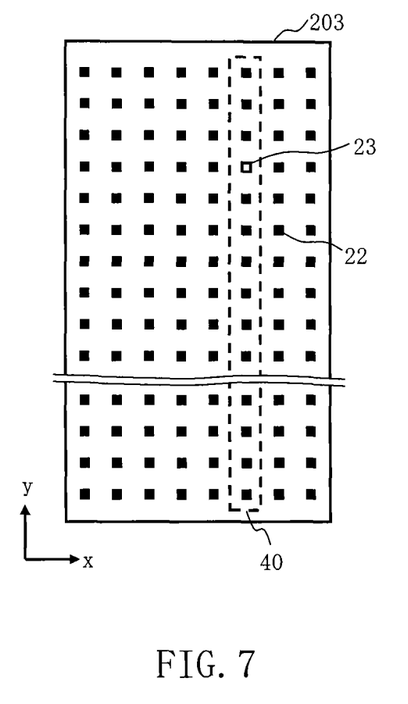
FIG. 7 is a schematic diagram showing an unused beam according to Embodiment 1.

FIG. 7 is a schematic diagram showing an unused beam according to Embodiment 1. In FIG. 7, a region including all the holes 22 in the sixth column from the left, where a hole 23 through which a defective beam passes is included, is set as an unused beam partial region 40.

According to Embodiment 1, as described below, writing processing is highly accurately performed even when a defective beam exists by performing multiple writing while executing position shifting.

In the shifting width setting step (S106), the shifting width setting unit 56 sets a shifting width to be used when performing multiple writing. According to Embodiment 1, multiple writing is performed while shifting the position so that the position of a defective beam may not be the same position, namely, may not overlap.

Figure 8A:
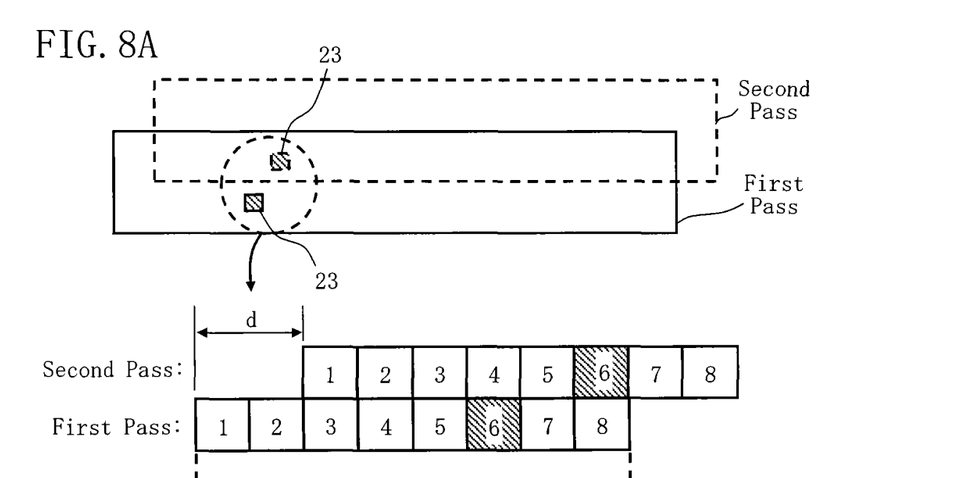
FIGS. 8A and 8B are schematic diagrams explaining a method of multiple writing according to Embodiment 1.
Figure 8B:
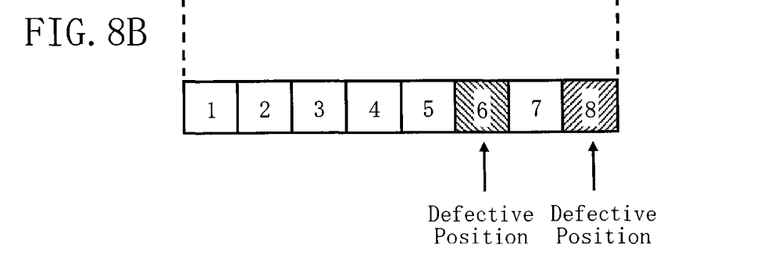

FIGS. 8A and 8B are schematic diagrams explaining a method of the multiple writing according to Embodiment 1. FIG. 8B shows one row in the case where the sixth column in 512 (rows)×8 (columns) of the holes 22 formed in the aperture member 203 is the unused beam partial region 40, as an example. FIG. 8A shows the case where multiple writing is performed twice. Moreover, FIG. 8B shows an example where, in performing the multiple writing, a shifting width d between the first writing (the first pass) and the second writing (the second pass) is set to be two columns of multi-beams.

In the coordinate list generation step (S108), the list generation unit 58 generates a coordinate list of meshes located at a defective beam. Specifically, the list is generated as follows: When the beam of the sixth column is a defective beam, it indicates that the beam of the sixth column in the first pass is a defective beam. Therefore, the position of the fourth column in the second pass is the same as that of the sixth column (defective beam) of the first pass. Moreover, the beam of the sixth column in the second pass is a defective beam. That is, the position of the eighth column of the first pass is the same as that of the sixth column (defective beam) of the second pass. Then, the list generation unit 58 combines the irradiation position of the defective beam of each pass as illustrated in FIG. 8B to generate a coordinate list 24 showing the irradiation position of the defective beam even if the position corresponds to the position of the defective beam only once. That is, in the example of FIG. 8B, the positions of the sixth column and the eighth column in the first pass are irradiation positions of the defective beam in the coordinate list 24. Writing processing is hereafter started using this coordinate list 24. Although only one row is described in this case, it is preferable to generate the coordinate list 24 such that irradiation positions of a defective beam in the entire writing region are specifically descried in a mesh state.

In the dose calculation step (S110), the dose calculation unit 60 calculates a dose required for each beam of each shot.

In the dose correction step (S112), the dose correction unit 62 corrects, using the coordinate list 24, the dose of a beam irradiating the irradiation position of a defective beam in the coordinate list 24 to be N/(N−1) times the dose. For example, when performing multiple writing at multiplicity of N=2, the dose of a beam irradiating the irradiation position of a defective beam in the coordinate list 24 is corrected to be twice the dose. In the example of FIG. 8B, the dose of the beam to irradiate the positions of the sixth column and the eighth column of the first pass in the coordinate list 24 is corrected to be twice the dose.

In the writing step (S114), the writing processing control unit 52 controls the relay circuit 122 to cut (block) the beam of a defective beam position (position corresponding to the unused beam partial region 40) in the multiple beams formed by a plurality of holes 22 provided in the aperture member 203. The relay circuit 122 applies the voltage from the constant voltage source 120 to a corresponding blanker 212 to drive it. Then, the blanker 212 performs deflection so that the beam of a corresponding defective beam position may be "beam off". In the example of FIG. 8B, since the sixth column in the holes 22 of 512 (rows)×8 (columns) is the unused beam partial region 40, deflection is performed such that the beam of the sixth column becomes "beam off". The electron beam 20 deflected by the blanker 212 shifts from the hole at the center of the limiting aperture member 206 (blanking aperture member) and is blocked by the limiting aperture member 206. The blanker 212 continues to always cut the beam at the defective beam position during the writing operation.

Then, the writing data processing unit 54 controlled by the writing processing control unit 52 reads writing data from the storage device 140, performs data conversion processing of a plurality of steps, and generates shot data unique to the apparatus, for each stripe region 32. The blanking control circuit 130 generates a signal for blanking control of a shot performed by each blanker 204 for each of shot timings, based on the shot data, and the signal is amplified by the blanking amplifier 134 and converted from a digital to an analog signal to be output to each blanker 204. It is not necessary to take a beam of a defective beam position into consideration in particular. Since a beam of a defective beam position has already been cut by the blanker 212, it is possible to cut the beam even if controlled to be "beam on" by the blanker 204.

The deflection control circuit 132 calculates deflection amounts in the x and y directions of each shot, generates a signal for deflection. Then, the signal is amplified by the DAC amplifier 136 and converted from a digital to an analog signal to be output to the deflector 208.

The writing unit 150 performs multiple writing while executing position shifting so that the position of a defective beam may not be the same position, namely, may not overlap, by using at least one of the remaining multiple beams in the state where the defective beam has been controlled to be "beam off". Specifically, the first pass is written first.

In the judgment step (S116), the writing processing control unit 52 judges whether writing of multiple times has been performed or not, and when it is still necessary to perform writing for finishing the multiple times writing, it returns to the dose calculation step (S110) to repeat from the dose calculation step (S110) to the judgment step (S116). Then, writing of the second pass is performed while executing position shifting so that the position of a defective beam may not be the same position.

According to Embodiment 1, the dose which has not been used for irradiation because it is at the position of a defective beam is added to the dose of other beam for multiple writing. In the example of FIGS. 8A and 8B, since the irradiation dose of the beam to be delivered to the positions of the sixth column and the eighth column in the first pass has already been corrected to be twice the dose, the beam dose of the eighth column of the first pass and the beam dose of the fourth column of the second pass will irradiate the target object 101 as the doubled dose respectively. Therefore, the dose which was not delivered because of being a defective beam can be compensated.

As described above, according to Embodiment 1, it is possible to prevent the target object from being irradiated by a defective beam which is continuously "beam on" or whose dose cannot be controlled within a predetermined irradiation time period. Moreover, it is possible to perform writing without reducing the writing accuracy even when there exists a defective beam. Further, it is possible to inhibit the reduction of throughput since beams other than the beam in one row where a defective beam exists can be used. Furthermore, in performing multiple writing, since an insufficient dose which was not delivered because of being at a defective beam position can be compensated when performing writing of other pass, additional pass writing becomes unnecessary and throughput reduction can be inhibited.

Embodiment has been explained referring to concrete examples described above. However, the present invention is not limited to these specific examples. Although the entire one row in which a defective beam exists is not used in the above example, it is also acceptable not to use only a defective beam. Moreover, in the above example, although the irradiation dose which was not delivered because of being at a defective beam position is added to the dose of other beam used in multiple writing without increasing the number of times of multiple writing, it is not limited thereto. Instead of adding the dose described above, it is also acceptable to further perform additional pass writing which irradiates only an irradiation position of a defective beam. In the above example, although the plurality of blankers 212 and the plurality of blankers 204 are arranged on the same blanking plate 214, it is not limited thereto. One of the plurality of blankers 212 and the plurality of blankers 204 may be arranged on the blanking plate 214, another of the plurality of blankers 212 and the plurality of blankers 204 may be arranged on an another plate.

While the apparatus configuration, control method, etc. not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
   a stage configured to mount a target object thereon and be movable continuously;
   an emission unit configured to emit a charged particle beam;
   an aperture member, in which a plurality of openings are formed, configured to form multiple beams by letting a region including a whole of the plurality of openings be irradiated by the charged particle beam and letting parts of the charged particle beam respectively pass through a corresponding opening of the plurality of openings;

a plurality of first blankers configured to respectively perform blanking deflection of a corresponding beam in multiple beams having passed through the plurality of openings of the aperture member;

a plurality of second blankers configured to deflect a defective beam in the multiple beams having passed through the plurality of openings of the aperture member to be in a direction orthogonal to a deflection direction of the plurality of first blankers, second blankers for openings of a same column in the plurality of openings of the aperture member, of the plurality of second blankers, being respectively configured by a pair of common electrodes, and only beams of the same column including the defective beam in the multiple beam being deflected by the corresponding pair of common electrodes;

a blanking aperture member configured to block each of beams which were deflected to be in a beam off state by at least one of the plurality of first blankers and the plurality of second blankers;

a detection processing unit configured to detect the defective beam in the multiple beams having passed through the plurality of openings of the aperture member; and a blanking plate on an upper surface of which the plurality of second blankers are arranged, on an under surface of which the plurality of first blankers are arranged, and in which a plurality of openings, where a corresponding beam in the multiple beams passes through a corresponding opening in the plurality of openings, are formed.

2. The apparatus according to claim 1, further comprising:
a constant voltage source; and
a relay circuit of a mechanical switch system,
wherein the plurality of second blankers are driven by the constant voltage source and the relay circuit.

3. The apparatus according to claim 1, further comprising:
a setting unit, configured by circuitry or a computer, to set, as unused beams, beams formed by using a line of openings including an opening through which a defective beam passes in the plurality of openings of the aperture member.

4. The apparatus according to claim 3, further comprising:
a shifting width setting unit, configured by the circuitry or the computer, to set a width of shifting in performing multiple writing.

5. The apparatus according to claim 4, further comprising:
a list generation unit configured, by the circuitry or the computer, to generate a coordinate list of meshes located at the defective beam.

6. The apparatus according to claim 5, further comprising:
a dose correction unit configured, by the circuitry or the computer, to correct, using the coordinate list, a dose of a beam irradiating an irradiation position of the defective beam in the coordinate list to be multiplicity/(multiplicity−1) times the dose.

7. A multi charged particle beam writing apparatus comprising:
a stage configured to mount a target object thereon and be movable continuously;
an emission unit configured to emit a charged particle beam;
an aperture member, in which a plurality of openings are formed, configured to form multiple beams by letting a region including a whole of the plurality of openings be irradiated by the charged particle beam and letting parts of the charged particle beam respectively pass through a corresponding opening of the plurality of openings;
a plurality of first blankers configured to respectively perform blanking deflection of a corresponding beam in multiple beams having passed through the plurality of openings of the aperture member;
a plurality of second blankers configured to deflect a defective beam in the multiple beams having passed through the plurality of openings of the aperture member to be in a direction orthogonal to a deflection direction of the plurality of first blankers, second blankers for openings of a same column in the plurality of openings of the aperture member, of the plurality of second blankers, being respectively configured by a pair of common electrodes, and only beams of the same column including the defective beam in the multiple beam being deflected by the corresponding pair of common electrodes;
a blanking aperture member configured to block each of beams which were deflected to be in a beam off state by at least one of the plurality of first blankers and the plurality of second blankers;
a detection processing circuit configured to detect the defective beam in the multiple beams having passed through the plurality of openings of the aperture member.

* * * * *